(12) United States Patent
Chhabra et al.

(10) Patent No.: US 10,560,116 B2
(45) Date of Patent: Feb. 11, 2020

(54) PROBABILITY-BASED OPTIMIZATION OF SYSTEM ON CHIP (SOC) POWER

(71) Applicant: Seagate Technology LLC, Cupertino, CA (US)

(72) Inventors: Nitin Kumar Chhabra, Maharashtra (IN); Rohit Halba, Madhya Pradesh (IN); Shashi Kumar Shaw, West Bengal (IN); Shrikrishna Nana Mehetre, Maharashtra (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 93 days.

(21) Appl. No.: 15/854,222

(22) Filed: Dec. 26, 2017

(65) Prior Publication Data
US 2019/0199371 A1    Jun. 27, 2019

(51) Int. Cl.
| | | |
|---|---|---|
| *H03M 11/00* | (2006.01) | |
| *H03M 7/30* | (2006.01) | |
| *H04L 25/02* | (2006.01) | |
| *G06F 13/42* | (2006.01) | |
| *H04L 27/06* | (2006.01) | |
| *H03M 5/16* | (2006.01) | |
| *H03K 19/0185* | (2006.01) | |
| *H04L 25/49* | (2006.01) | |
| *H03K 19/0175* | (2006.01) | |

(52) U.S. Cl.
CPC ........ *H03M 7/3055* (2013.01); *G06F 13/426* (2013.01); *H03M 5/16* (2013.01); *H04L 25/0276* (2013.01); *H04L 27/06* (2013.01); *H03K 19/017509* (2013.01); *H03K 19/018521* (2013.01); *H04L 25/49* (2013.01)

(58) Field of Classification Search
None
See application file for complete search history.

(56) References Cited

U.S. PATENT DOCUMENTS

| | | | |
|---|---|---|---|
| 7,358,869 B1 | 4/2008 | Chiarulli et al. | |
| 9,075,733 B1 * | 7/2015 | Feldman | ............. G06F 12/0292 |
| 9,357,036 B2 | 5/2016 | Fox et al. | |
| 9,362,962 B2 | 6/2016 | Simpson et al. | |
| 9,362,974 B2 | 6/2016 | Fox et al. | |
| 9,686,107 B2 | 6/2017 | Fox et al. | |
| 2008/0192720 A1 * | 8/2008 | Frederiksen | ........ H04L 25/0236 370/344 |
| 2013/0010892 A1 * | 1/2013 | Cronie | ................ H04L 25/0276 375/296 |
| 2015/0058647 A1 * | 2/2015 | Noro | ..................... G06F 1/3228 713/323 |

* cited by examiner

*Primary Examiner* — Daniel F. McMahon
(74) *Attorney, Agent, or Firm* — Westman, Champlin & Koehler, P.A.

(57) ABSTRACT

A method includes, for an N-bit system on chip (SoC), calculating a minimum number of bits $N_P$ that can simultaneously switch without producing an error across a complete warranty time period of the N-bit SoC. The method also includes carrying out power estimation calculations for the N-bit SoC using the calculated minimum number of bits $N_P$.

20 Claims, 10 Drawing Sheets

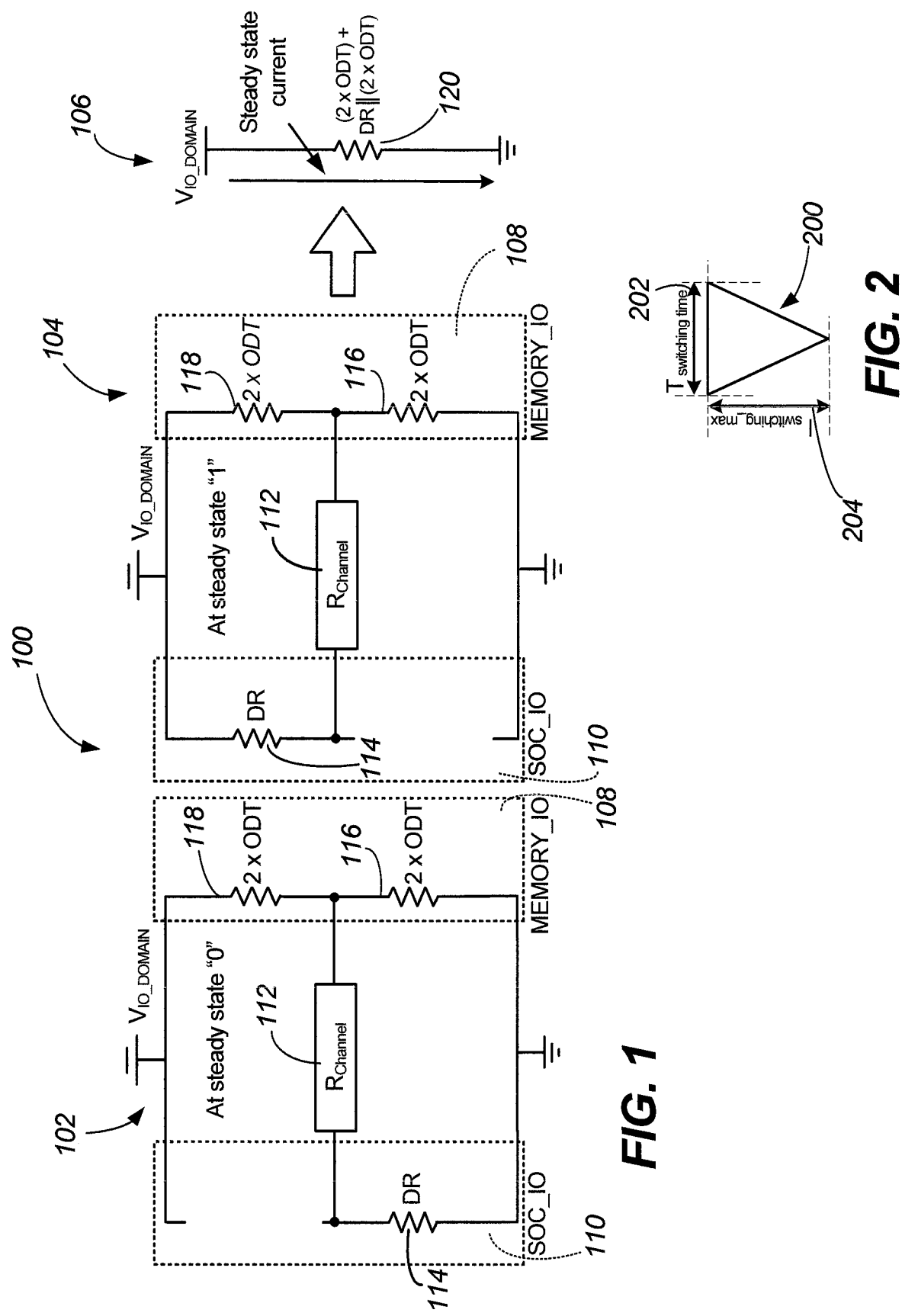

PROBABILITY-BASED OPTIMIZATION OF SYSTEM ON CHIP (SOC) POWER

SUMMARY

In one embodiment, a method includes, for an N-bit system on chip (SoC), calculating a minimum number of bits $N_P$ that can simultaneously switch without producing an error across a complete warranty time period of the N-bit SoC. The method also includes carrying out power estimation calculations for the N-bit SoC using the calculated minimum number of bits $N_P$.

In another embodiment, a method includes receiving a number of channels to be employed in a system on chip (SoC), and determining a number of bits N for the SoC based on the number of channels and based on a number of bits per channel. The method also includes receiving warranty information for the SoC. Based on the bits N and the warranty information, a minimum number of bits $N_P$ that can simultaneously switch without producing an error across a complete warranty time period of the N-bit SoC is calculated.

In yet another embodiment, a computer-readable storage medium having encoded therein computer-executable instructions for causing a computing system programmed thereby to perform a method is provided. The method includes, for an N-bit system on chip (SoC), calculating a minimum number of bits $N_P$ that can simultaneously switch without producing an error across a complete warranty time period of the N-bit SoC. The method also includes carrying out power estimation calculations for the N-bit SoC using the calculated minimum number of bits $N_P$.

This summary is not intended to describe each disclosed embodiment or every implementation of the probability-based optimization of SoC power disclosed herein. Many other novel advantages, features, and relationships will become apparent as this description proceeds. The figures and the description that follow more particularly exemplify illustrative embodiments.

BRIEF DESCRIPTION OF THE DRAWINGS

FIG. 1 is a circuit level model of an example Flash memory interface for a write cycle;

FIG. 2 is a diagrammatic illustration in which a switching current is simplified as a triangle;

DETAILED DESCRIPTION OF ILLUSTRATIVE EMBODIMENTS

Figure 3:
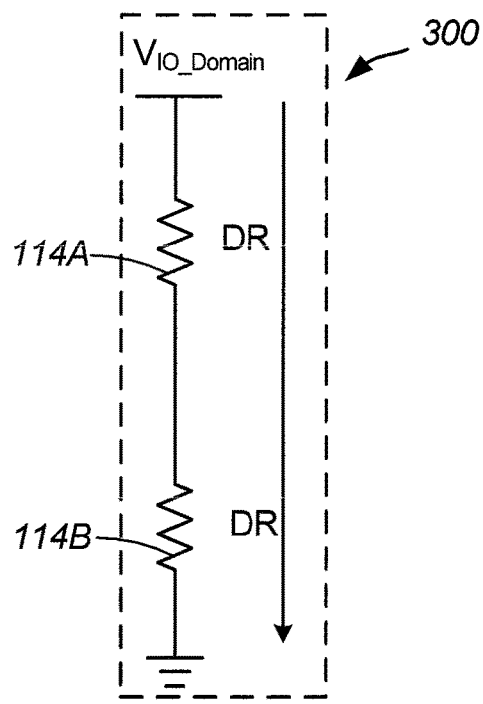
FIG. 3 shows a simplified circuit for a switching state of a single Flash memory input/output (I/O) driver.

Embodiments of the disclosure relate to increasing a capacity of a SoC (system on chip) without linearly increasing the power for the SoC, thereby saving power. The SoC power or current has two components: 1) a steady state component, which is a substantially constant current drawn to maintain a steady state (e. g., a constant 0 or a constant 1), and 2) a switching current that is drawn when a transition occurs from a 1 to a 0 or a 0 to a 1. If the switching current is x when 1 bit transitions from 0 to 1 (or 1 to 0), that current doubles to 2x when 2 bits simultaneously switch. In essence, the switching current linearly increases with the increase in the number of bits switching simultaneously.

For an N-bit SoC, power calculations are currently carried out based on all of the N bits of the SoC simultaneously switching. However, the disclosure recognizes that, as N increases (e.g., the capacity of the SoC increases), the probability of all N bits simultaneously switching decreases. Accordingly, to save power, embodiments of the disclosure determine SoC power by using a probability-based method. The method includes, for an N-bit SoC, calculating a minimum number of bits $N_P$ that simultaneously switch without producing an error across a complete warranty time period of the N-bit SoC. The calculated minimum number of bits $N_P$ may be less than N. The method further includes carrying out power estimation calculations for the N-bit SoC using the calculated minimum number of bits $N_P$. Prior to providing details regarding power estimation calculations using the calculated minimum number of bits $N_P$, examples of general SoC power estimation calculations are provided in connection with FIGS. 1-3.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Power estimation may be carried out at an initial stage of the SoC design cycle. Initial power calculation is based on Ohm's Law (e.g., "VI" power calculation), where the total input/output (I/O) current is computed and then multiplied with a nominal I/O supply voltage. As indicated above, the total I/O current is divided into steady state and switching currents. Examples of steady state current calculations are described below with the help of an example Flash I/O interface.

FIG. 1 shows a circuit level model 100 of an example Flash memory interface for a write cycle. Circuit level model 100 includes a first circuit model component 102 at steady state "0", a second circuit model component 104 at steady state "1" and a third simplified common circuit model component 106 for both steady state "0" and steady state "1". In the example of FIG. 1, a memory I/O 108 and a SoC I/O 110 are connected to a same VRM (voltage regulator module), which provides a supply voltage $V_{IO\_DOMAIN}$ shown in FIG. 1. Circuit level model 100 includes channel resistance $R_{CHANNEL}$ 112 and resistors 114, 116, 118 and 120. In circuit level model 100, steady state currents for states "0" and "1" would be the same. The value of steady state currents for $R_{CHANNEL} \ll$ ODT (116, 118), DR (114) are provided in Equations 1 and 2.

$$\text{Isteady\_state\_0} = \frac{VIO\_DOMAIN}{DR\|(2 \times ODT) + (2 \times ODT)} \quad \text{Equation 1}$$

$$\text{Isteady\_state\_1} = \frac{VIO\_DOMAIN}{DR\|(2 \times ODT) + (2 \times ODT)} \quad \text{Equation 2}$$

The steady state current on a Flash interface is affected by the following two parameters:
 a. Driving strength—It is an equivalent resistance (DR 114 in FIG. 1) of the I/O in a driving mode. It specifies a maximum load that the I/O can drive. The lower the driving strength value, the higher the current that the I/O can draw.
 b. On-die termination—It is the termination resistance (ODT in FIG. 1) on data (DQ) and strobe (DQS) signals, which is mainly used to reduce reflection on the channel. A lower value of ODT gives a high steady state current.

As indicated above, the switching current is the current drawn from the I/O supply at the time of switching (e.g., the current supplied when a transition occurs from a 1 to a 0 or a 0 to a 1). FIG. 2 is a diagrammatic illustration in which the switching current is simplified as a triangle 200. A base 202 of triangle 200 represents a switching time ($T_{SWITCHING\_TIME}$) and a height 204 of triangle 200 represents a maximum switching current ($I_{SWITCHING\_MAX}$).

FIG. 3 shows a simplified circuit 300 for a switching state of a single Flash I/O driver. As in the case of FIG. 1, the supply voltage is $V_{IO\_DOMAIN}$. Circuit 300 includes two resistors 114A and 114B, which are connected in series. The maximum switching current is calculated using Equation 3 below.

$$I_{SWITCHING\_MAX} = \frac{V_{IO\_DOMAIN}}{2 \times DR} \quad \text{Equation 3}$$

Consider a Flash I/O domain having "ch" channels with each of the ch channels including "8" single ended data I/Os and "1" differential strobe I/O, with the differential strobe I/O having a switching current that is twice the switching current of the single ended data I/O. Here, the total maximum switching current is $$I_{SWITCHING\_MAX\_TOTAL} = (N \times I_{SWITCH\_DATA}) + (N_{STROBE} \times I_{SWITCH\_STROBE}) \quad \text{Equation 4}$$

and the maximum switching power is $$P_{IOSWITCHING\_MAX} = V_{IO\_DOMAIN} \times I_{SWITCHING\_MAX\_TOTAL} \quad \text{Equation 5}$$

In equations 3, 4 and 5:
 N=ch×8=8ch (Number of single ended data I/Os).
 $N_{STROBE}$=ch×1=ch (Number of differential strobe I/Os).
 $I_{SWITCH\_DATA}$=Switching current of a data I/O.
 $I_{SWITCH\_STROBE}$=Switching current of a strobe I/O=2× $I_{SWITCH\_DATA}$.
 $V_{IO\_DOMAIN}$=I/O supply voltage.
 DR=I/O driving strength in Ohms.

Figure 4:
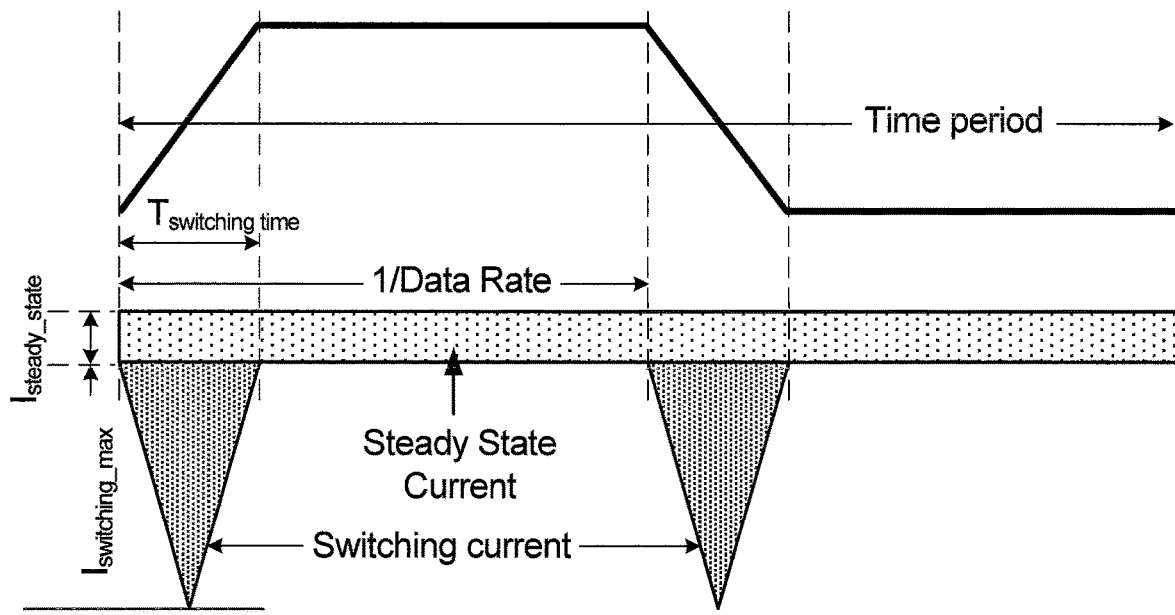
FIG. 4 is a diagrammatic illustration showing a worst case current profile for one write cycle.

An average current may be obtained by averaging instantaneous current values over a given time period. In other words, the average current of a signal may be the area under a waveform with respect to a time axis. The Flash I/O domain is taken as an example to explain average current. A current profile for a worst case of one write cycle is shown in FIG. 4. FIG. 4 also shows a constant steady state current drawn by the I/O over the time period and a peak switching current drawn by the I/O during switching. A formula to calculate average current is provided in Equation 6 below.

$$I_{Average} = \frac{1}{T} \int_{O}^{T} I(t)dt \quad \text{Equation 6}$$

Equation 7 below is used to calculate the average current of the waveform shown in FIG. 4.

$$I_{AVERAGE\_IO} = \frac{1}{T} \times \text{Area under the waveform} \quad \text{Equation 7}$$

The waveform shown in FIG. 4 is symmetric across a half cycle, with steady state current at 0 and 1 being the same and switching current from 0 to 1 and 1 to 0 also being the same. Therefore, Equation 7 could be simplified as shown below:

$$I_{AVERAGE\_IO} = \quad \text{Equation 8}$$
$$\text{Data Rate} \times \text{Area under the waveform for half time cycle}$$

$$I_{AVERAGE\_IO} = \quad \text{Equation 9}$$
$$\text{Data Rate} \times (\text{Area covered by switching current triangle} + \text{Area covered by steady state current rectangle})$$

$$I_{AVERAGE\_IO} = \text{Data Rate} \times \quad \text{Equation 10}$$
$$\left[\left(\frac{1}{2} \times I_{SWITCH\_DATA} \times T_{SWITCHING\_TIME}\right) + \left(\frac{I_{STEADYSTATE}}{\text{Data Rate}}\right)\right]$$

$$I_{AVERAGE\_IO} = I_{STEADY\_STATE} + \quad \text{Equation 11}$$
$$\left[\left(\frac{1}{2} \times \text{Data Rate} \times I_{SWITCH\_DATA} \times T_{SWITCHING\_TIME}\right)\right]$$

For a "ch" channel Flash I/O domain, there would be "N" data bits and "ch" strobe bits. The max average current for data I/Os is provided in Equation 12A below.

$$I_{AVERAGE\_DATA} = N \times I_{STEADY\_STATE} + [\frac{1}{2} \times \text{Data Rate} \times (N \times I_{SWITCH\_DATA}) \times T_{SWITCHING\_TIME}] \quad \text{Equation 12A}$$

For "ch" strobe bits, the average current is provided in Equation 12B below.

$$I_{AVERAGE\_STROBE}=ch \times I_{STEADY\_STATE\_STROBE}+[(\frac{1}{2} \times \text{Data Rate} \times (ch \times I_{SWITCH\_STROBE}) \times T_{SWITCHING\_TIME})]$$ Equation 12B Total average current is provided in Equation 12C below.

$$I_{AVERAGE}=I_{AVERAGE\_DATA}+I_{AVERAGE\_STROBE}$$ Equation 12C

The average power is provided in Equation 13 below.

$$P_{AVERAGE}=I_{AVERAGE} \times V_{IO\_DOMAIN}$$ Equation 13

In equations 6-13:
Data Rate=Data rate of signal in MTPS (mega transfers per second).
T=2/Data Rate=Time period of data signal in seconds.
$I_{STEADY\_STATE}$=Steady state current drawn by the I/O.
$I_{SWITCH\_DATA}$=Switching current drawn by the I/O.
$I_{SWITCH\_STROBE}$=Switching current drawn by strobe I/O.
$I_{STEADY\_STATE\_STROBE}$=Steady state current drawn by differential I/O.
$T_{SWITCHING\_TIME}$=Time for which I/Os draw a switching current.

In order to meet the increasing demand for data storage, the capacity of a SoC may be increased by selecting a higher number of Flash memory channels. As the number of channels increases, the number of data bits increases (e.g., each channel includes 8 data bits and 1 strobe bit), thereby increasing the simultaneous switching bits. The greater the simultaneous switching bits, the more the current. In other words, to cope with the increased Flash memory channels, the average power demand also increases due to more current consumption.

As indicated above, conventional solutions are too pessimistic as they would consider all data bits switching while calculating the maximum average power. Thus, as noted above, a probability-based methodology is implemented, which calculates the minimum number of data bits switching without giving any error across the complete warranty time of the product. To demonstrate why a probability-based method is suitable, an example comparing 8 bit and 64 bit Flash memory systems is discussed below in connection with FIGS. 5A and 5B.

A probability of switching of all "N" bits simultaneously is given by Equation 14.

$$P(\text{switching}) = \left(\frac{1}{2}\right)^N$$ Equation 14

Figure 5A:
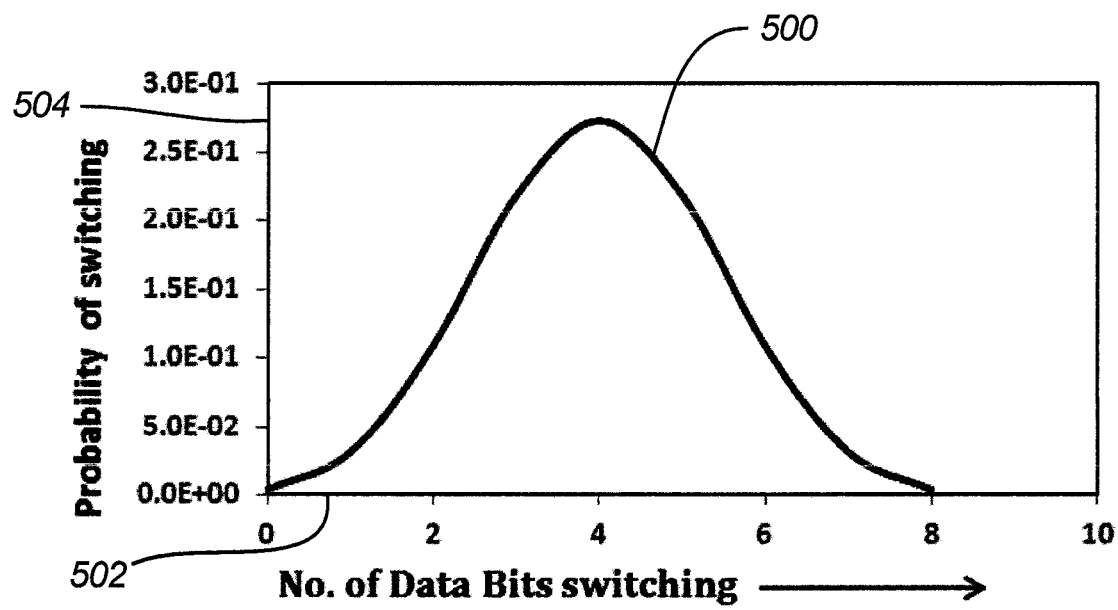
FIGS. 5A and 5B are graphs showing probability distribution curves.

FIG. 5A is a graph showing a probability distribution curve 500 for N=8 bits. In FIG. 5A, horizontal axis 502 represents a number of data bits switching and vertical axis 504 represents a probability of switching. From curve 500, it is seen that the probability of switching covers the whole span of the 8 data bits and the probability of all 8 bits switching simultaneously is $(\frac{1}{2})^8=10^{-3}$.

Figure 5B:
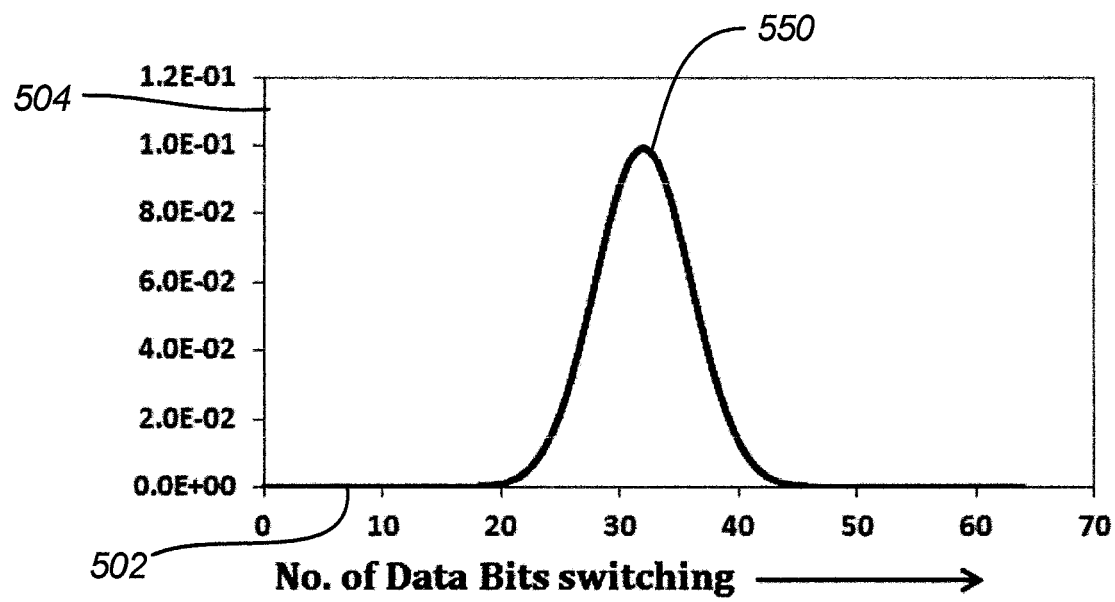

FIG. 5B is a graph showing a probability distribution curve 550 for N=64 bits. As in the case of FIG. 5A, in FIG. 5B, horizontal axis 502 represents a number of data bits switching and vertical axis 504 represents a probability of switching. In FIG. 5B, it is seen that there is shrinkage in an area under curve 550 (compared to an area under curve 500 of FIG. 5A) such that substantially all of the area under curve 550 is in a maximum probability region around the median. The probability of simultaneous switching of all 64 bits is $\approx 10^{-20}$, which is substantially lower the probability of switching for N=8 ($\approx 10^{-3}$ as noted above). In this methodology, a binomial theorem, in Equation 15 below, is used to find the probability of "R" bits switching simultaneously out of a total number of "N" of data bits.

$$P(R) = \binom{N}{R} P^R (1-P)^{N-R}$$ Equation 15

The probability of simultaneous switching of "59" bits out of total "64" bits calculated using Equation 15 is $\approx 4.13 \times 10^{-13}$. In an example memory device having a warranty period of 5 years and a 10 gigabyte (GB) per day data handling capacity, the maximum switching of any one bit in 5 years for a 64 bit data bus is $(10 \times 10^9 \times 8 \times 5 \times 365) \div 64 = 2.28 \times 10^{12}$. Since the probability of "59" bits switching is less than the maximum switching possible in a complete lifetime, any switching beyond this could be ignored without introducing any data error. Using the probability theorem, a break-even point is computed where the probability of minimum simultaneously switching bits is computed without compromising data integrity. The minimum simultaneously switching bits could be further lowered in case the SoC has a back to back error correction mechanism.

Figure 6:
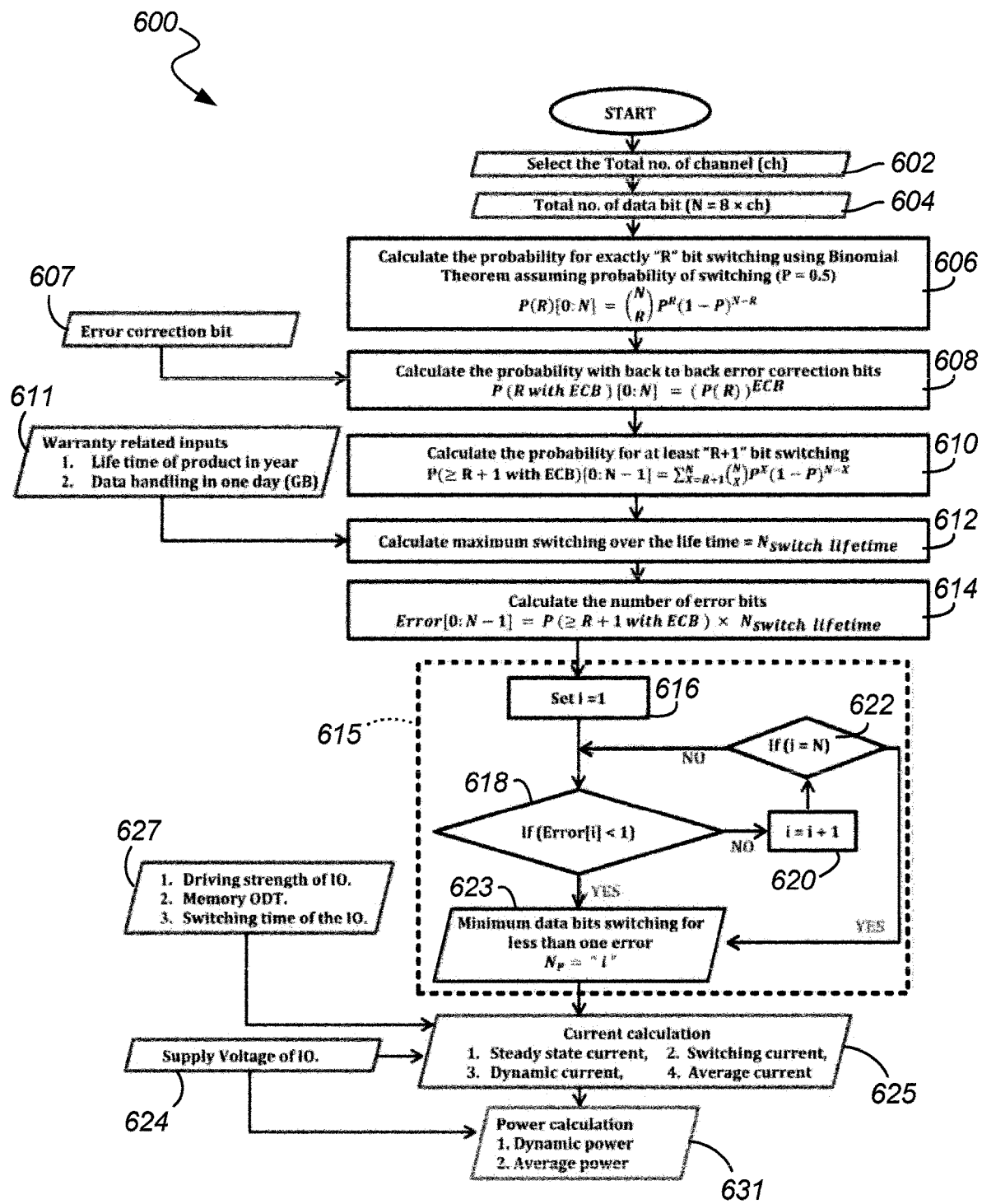
FIG. 6 is a flow chart diagram of a method embodiment.

FIG. 6 is a flow diagram 600 of a method embodiment that may be performed by a computing device. An example of a computing device capable of carrying out the method embodiment is provided further below in connection with FIG. 7. At step 602, a desired total number of channels (ch) for a Flash I/O domain is taken as an input into the computing device. At step 604, a total number of data bits for the number of channels input is calculated. In one embodiment, each channel is assumed to have 8 data bits and 1 strobe bit. In such an embodiment, the total number of data bits N=8×ch.

A data bit has four transition states 0→0, 1→1, 1→0 and 0→1, but only two states 0→1 and 1→0 draw switching current. For the remaining transition states 0→0 and 1→1, switching current is zero (and the steady state current flows). Hence, the probability of switching is defined by Equation 16 below.

$$P(\text{switching}) = \frac{\text{Total number of favorable outcomes}}{\text{Total number of possible outcomes}} = \frac{2}{4} = 0.5$$ Equation 16

At step 606, a binomial probability theorem in Equation 17 below is used to calculate the probability of "R" data bits switching out of the total of "N" data bits.

$$P(R)\ [0:N] = \binom{N}{R} P^R (1-P)^{N-R}$$ Equation 17

In case the SoC has an error correction mechanism, an extra error correction bit (ECB) 607 is taken as an input to find a back to back error probability. A decision regarding how many times the original data should be resent by the memory to the host if the data is incorrect is decided based on the ECB value. At step 608, Equation 18 below is used to calculate the probability of R bits switching considering the ECB.

$$P(R \text{ with ECB})[0:N]=[P(R)]^{ECB}$$ Equation 18

A probability of at least "R+1" bits switching simultaneously is the sum of probabilities from "R+1" bits switching to "N" bits switching. At step 610, Equation 19 below is used to calculate the probability of at least "R+1" bits switching.

$$P(\geq R+1 \text{ with } ECB)[0:N-1] = \sum_{X=R+1}^{N} \binom{N}{X} P^X (1-P)^{N-X} \quad \text{Equation 19}$$

To calculate a maximum switching of a bit over a life cycle of the product (e.g., the Flash memory), parameters shown in box 611 and included below are employed:
1. Warranty period of the product (WP)—lifetime of the product (e.g., the Flash memory) in years.
2. Data handling in one day (GB)—data read from/written to the Flash memory in one day. Equation 20 below is used to calculate a maximum number of times a data bit can switch in one day.

$$N\text{switching\_one\_day} = \frac{[\text{Data handling in one day } (GB) \times 10^9 \times 8]}{\text{Total no. data bits}} \text{ bit/day} \quad \text{Equation 20}$$

At step 612, Equation 21 below is used to calculate the maximum number of times a data bit can switch over the product's life cycle.

$$N\text{Switch\_lifetime} = N\text{Switch\_one\_day} \times (WP) \times 365 \quad \text{Equation 21}$$

A number of error bits over the product's life cycle is calculated by multiplying the maximum number of times a data bit can switch over the product's life cycle (calculated in Equation 21) with the probability of at least "R+1" bits switching simultaneously (calculated in Equation 19). At step 614, Equation 22 below is used to calculate the number of error bits over the product's life cycle.

$$\text{Error Bit}[R \rightarrow 0:N-1] = P(\geq R+1 \text{ with ECB}) \times N\text{Switch\_lifetime} \quad \text{Equation 22}$$

There is an error bit value for every switching bit (R), which is calculated using Equation 22. As the number of simultaneously switching bits increases, the number of error bits decreases. Whenever an error bit number is less than "1" or when "R=N" is reached, the corresponding switching bits "R" is the minimum number of bits for less than one error. The determination of a value for the minimum number of data bits switching for less than one error ($N_P$) is shown in box 615. At step 616, a bit counter "i" is set equal to 1. At step 618, a determination is made as to whether the bit error number (Error[i]) is less than 1. If Error[i] is less than 1 at step 618, then i becomes the value for $N_P$, which is show in box 623. If Error[i] is not less than 1, "i" is incremented by 1 at step 620. At step 622, a determination is made as to whether i is equal to N. If i is not equal to N, control returns to step 618. If i is equal to N, then the value of $N_P$ is equal to N.

The obtained value of $N_P$ is used to carry out certain electrical current calculations listed in box 625. Additional inputs used for the current calculations are shown in boxes 627 and 629. The electrical specifications of the I/O (Driving Strength) and the memory (ODT) are taken as inputs to calculate the steady state current. The steady state current calculation is based on a total number of data bits ($N_{DATA}$) and strobe bits ($N_{STROBE}$) present in the flash I/O domain. Equation 24 below is used to calculate the steady state current.

$$I_{STEADY\_STATE\_DATA\_IO} = \frac{V_{IO\_DOMAIN}}{DR \| (2 \times ODT) + (2 \times ODT)} \quad \text{Equation 23A}$$

$$I_{STEADY\_STATE\_STROBE\_IO} = \frac{2 \times V_{IO\_DOMAIN}}{DR \| (2 \times ODT) + (2 \times ODT)} \quad \text{Equation 23B}$$

$$I_{STEADY\_STATE} = (N_{DATA} \times I_{STEADY\_STATEDATA\_IO}) + (N_{STROBE} \times I_{STEADY\_STATE\_STROBE\_IO}) \quad \text{Equation 24}$$

As noted above, the minimum data bits switching for less than one bit error ($N_P$) ( ) is calculated in box 615, and that value is taken as an input to calculate the switching current and power. Equations 25 and 26 below are used to calculate the switching current and switching power, respectively.

$$I_{SWITCHING\_PROBABILITY} = (N_P \times I_{SWITCH\_DATA}) + (N_{STROBE} \times I_{SWITCH\_STROBE}) \quad \text{Equation 25}$$

$$P_{SWITCHING\_PROBABILITY} = I_{SWITCHING\_MAX} \times V_{IO\_DOMAIN} \quad \text{Equation 26}$$

The dynamic current is the sum of the steady state and switching currents. In other words, it is the total current drawn by the I/O at the time of switching. Equations 27 and 28 below are used to calculate dynamic current and dynamic power, respectively.

$$I_{DYNAMIC} = I_{STEADY\_STATE} + I_{SWITCHING\_PROBABILITY} \quad \text{Equation 27}$$

$$P_{DYNAMIC} = I_{DYNAMIC} \times V_{IO\_DOMAIN} \quad \text{Equation 28}$$

The switching time ($T_{SWITCHING\_TIME}$) is taken as an input to calculate the average current. The average current calculation is based on the steady state and switching currents. Equations 29 and 30 are used to calculate the average current and average power, respectively.

$$I_{AVERAGE\_PROB} = I_{STEADY\_STATE} + [(\tfrac{1}{2} \times \text{Data Rate} \times I_{SWITCHING\_PROBABILITY} \times T_{SWITCHING\_TIME})] \quad \text{Equation 29}$$

$$P_{AVERAGE\_PROB} = I_{AVERAGE\_PROB} \times V_{IO\_DOMAIN} \quad \text{Equation 30}$$

The power calculations are shown in parallelogram 631 of FIG. 6.

Figure 7:
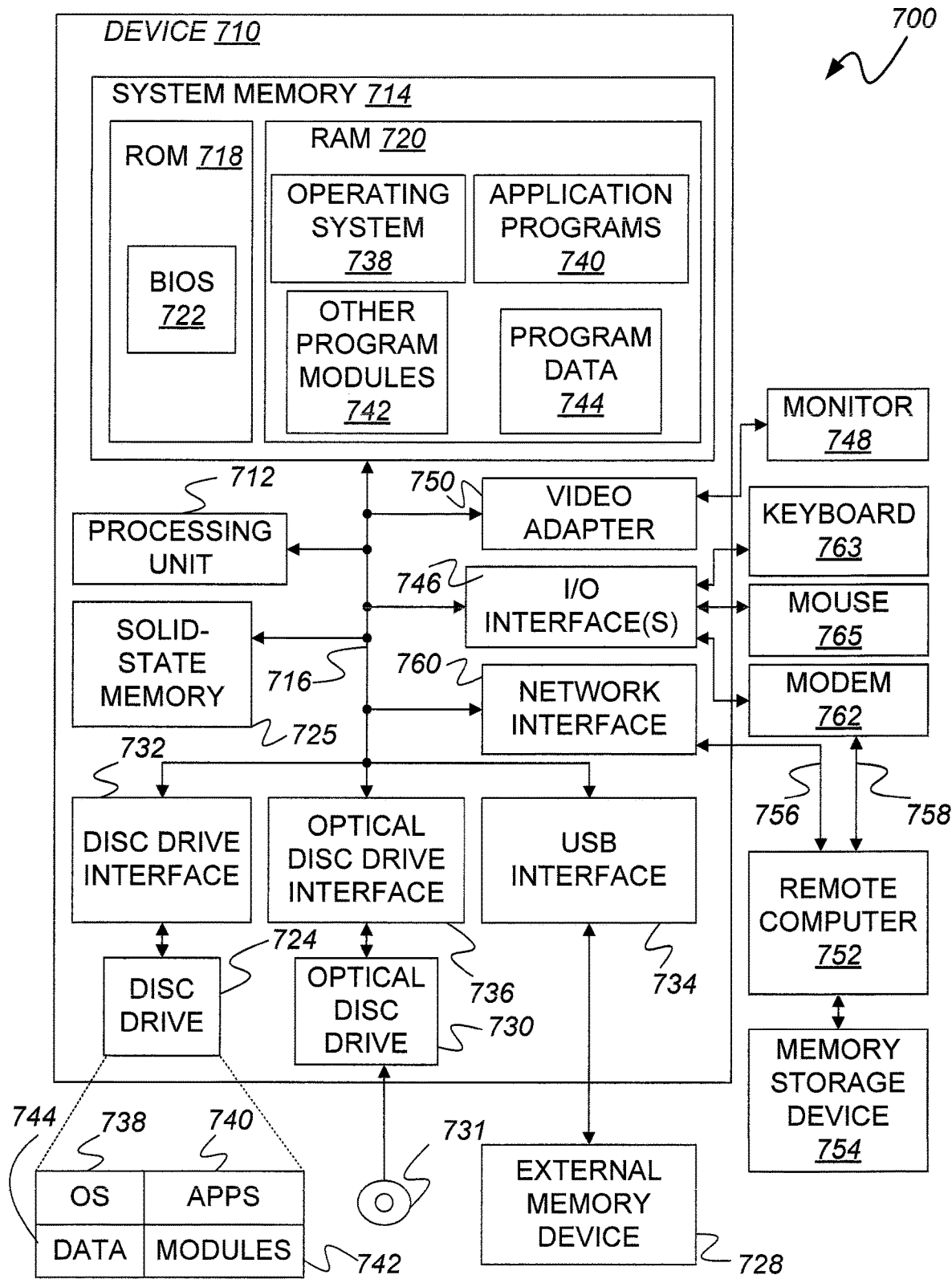
FIG. 7 illustrates an example of a computing environment in which at least some of the present embodiments may be implemented.

FIG. 7 illustrates an example of a suitable computing environment 700 in which the present embodiments may be implemented. The computing environment 700 is only one example of a suitable computing environment and is not intended to suggest any limitation as to the scope of use or functionality of the present embodiments.

The computing environment of FIG. 7 includes a processing unit 712, a system memory 714 and a system bus 716 that couples the system memory 714 to the processing unit 712. System memory 714 includes read only memory (ROM) 718 and random access memory (RAM) 720. A basic input/output system 722 (BIOS), containing the basic routines that help to transfer information between elements within the computing device 710, is stored in ROM 718. Computer-executable instructions that are to be executed by processing unit 712 may be stored in random access memory 720 before being executed.

Embodiments of the disclosure can be applied in the context of computer systems other than computing environment 700. Other appropriate computer systems include handheld devices, multi-processor systems, various consumer electronic devices, mainframe computers, and the like. Those skilled in the art will also appreciate that embodiments can also be applied within computer systems wherein tasks are performed by remote processing devices that are linked through a communications network (e.g., communication utilizing Internet or web-based software systems). For example, program modules may be located in either local or remote memory storage devices or simultaneously in both local and remote memory storage devices. Similarly, any storage of data associated with embodiments of the disclosure may be accomplished utilizing either local or remote storage devices, or simultaneously utilizing both local and remote storage devices.

Computing device 710 further includes a hard disc drive 724, an external memory device 728, and an optical disc drive 730. External memory device 728 can include an external disc drive or solid state memory that may be attached to computing device 710 through an interface such as Universal Serial Bus interface 734, which is connected to system bus 716. Optical disc drive 730 can illustratively be utilized for reading data from (or writing data to) optical media, such as a CD-ROM disc 731. Hard disc drive 724 and optical disc drive 730 are connected to the system bus 716 by a hard disc drive interface 732 and an optical disc drive interface 736, respectively. The drives and external memory devices and their associated non-transitory computer-readable media provide nonvolatile storage media for the computing device 710 on which computer-executable instructions and computer-readable data structures may be stored. Other types of media that are readable by a computer may also be used in the exemplary operation environment.

A number of program modules may be stored in the drives and RAM 720, including an operating system 738, one or more application programs 740, other program modules 742 and program data 744. In particular, application programs 740 can include code used to carry out probability-related calculations shown in FIG. 6.

Input devices including a keyboard 763 and a mouse 765 are connected to system bus 716 through an input/output interface 746 that is coupled to system bus 716. Monitor 748 is connected to the system bus 716 through a video adapter 750 and provides graphical images to users. Other peripheral output devices (e.g., speakers or printers) could also be included but have not been illustrated. In accordance with some embodiments, monitor 748 comprises a touch screen that both displays input and provides locations on the screen where the user is contacting the screen.

The computing device 710 may operate in a network environment utilizing connections to one or more remote computers, such as a remote computer 752. The remote computer 752 may be a server, a router, a peer device, or other common network node. Remote computer 752 may include many or all of the features and elements described in relation to computing device 710, although only a memory storage device 754 has been illustrated in FIG. 7. The network connections depicted in FIG. 7 include a local area network (LAN) 756 and a wide area network (WAN) 758. Such network environments are commonplace in the art.

The computing device 710 is connected to the LAN 756 through a network interface 760. The computing device 710 is also connected to WAN 758 and includes a modem 762 for establishing communications over the WAN 758. The modem 762, which may be internal or external, is connected to the system bus 716 via the I/O interface 746. Modem 762 may be a wired modem or wireless modem that receives and transmits signals through an antenna.

In a networked environment, program modules depicted relative to the computing device 710, or portions thereof, may be stored in the remote memory storage device 754. For example, application programs may be stored utilizing memory storage device 754. In addition, data associated with an application program may illustratively be stored within memory storage device 754. It will be appreciated that the network connections shown in FIG. 7 are exemplary and other means for establishing a communications link between the computers, such as a wireless interface communications link, may be used.

In general, the present embodiments are operational with numerous general purpose or special purpose computing system environments or configurations. Examples of well-known computing systems, environments, and/or configurations that may be suitable for use with the present embodiments include, but are not limited to, personal computers, server computers, hand-held or laptop devices, PDAs, multiprocessor systems, microprocessor-based systems, set top boxes, programmable consumer electronics, network PCs, minicomputers, mainframe computers, telephony systems, distributed computing environments that include any of the above systems or devices, and the like.

The present embodiments may be described in the general context of computer-executable instructions, such as program modules, stored on one or more computer-readable storage media (e.g., volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Generally, program modules include routines, programs, objects, components, data structures, etc. that perform particular tasks. The present embodiments may be designed to be practiced in distributed computing environments where tasks are performed by remote processing devices that are linked through a communications network. In a distributed computing environment, program modules are located in both local and remote computer storage media including memory storage devices.

Although the operations in some embodiments are described in a particular sequence, it should be understood that this manner of description encompasses rearrangement. For example, operations described sequentially may in some cases be rearranged or performed to operate in parallel.

It should be noted that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

Figure 8:
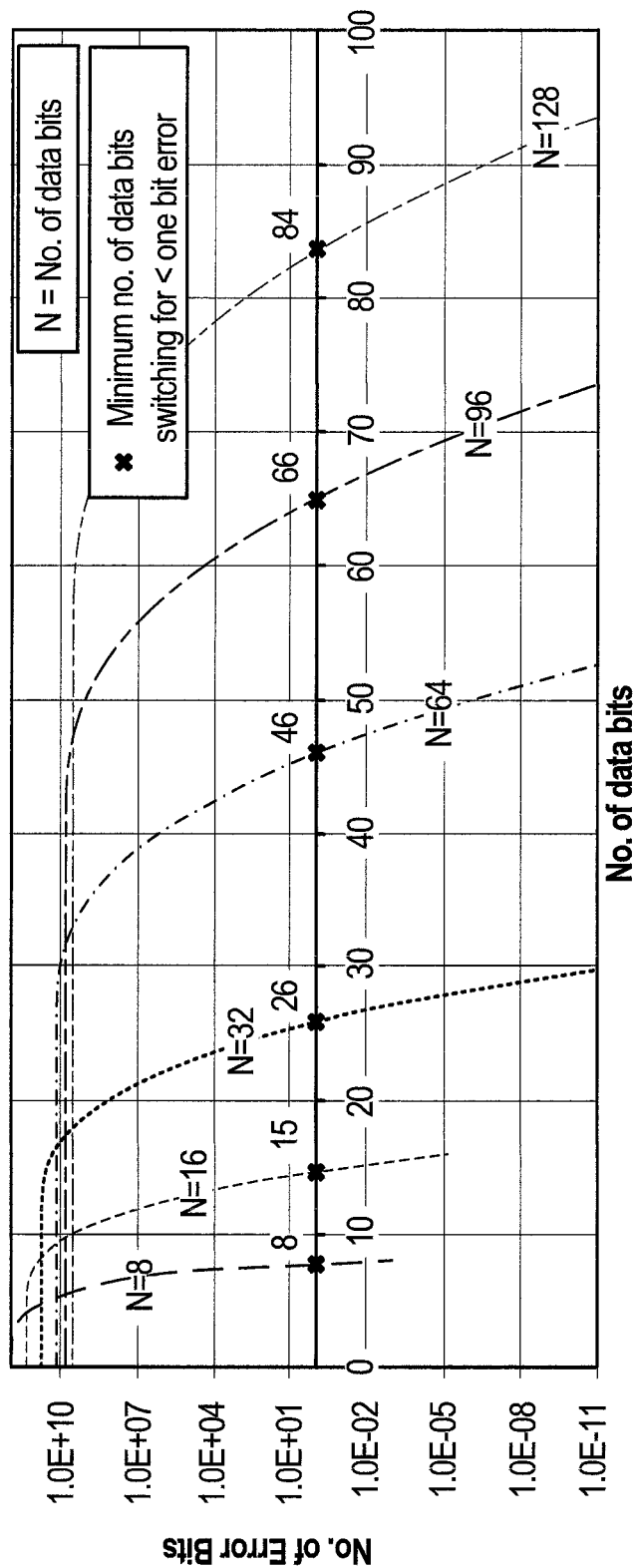
FIG. 8 is a graph showing error variation for different numbers of data bits.

A software tool developed to verify the methodology shown in FIG. 6 is capable of running in the computing environment of FIG. 7. The software tool takes a number of channels for the SoC as an input and calculates a minimum number of bits that simultaneously switch without producing an error. The calculated minimum number of bits that simultaneously switch without producing an error is used to compute average and dynamic power for the SoC. FIG. 8 is a graph that includes plots showing the minimum number of data bits switching out of a total number of data bits, so that the total number of error bits is less than one for ECB=3.

Figure 9:
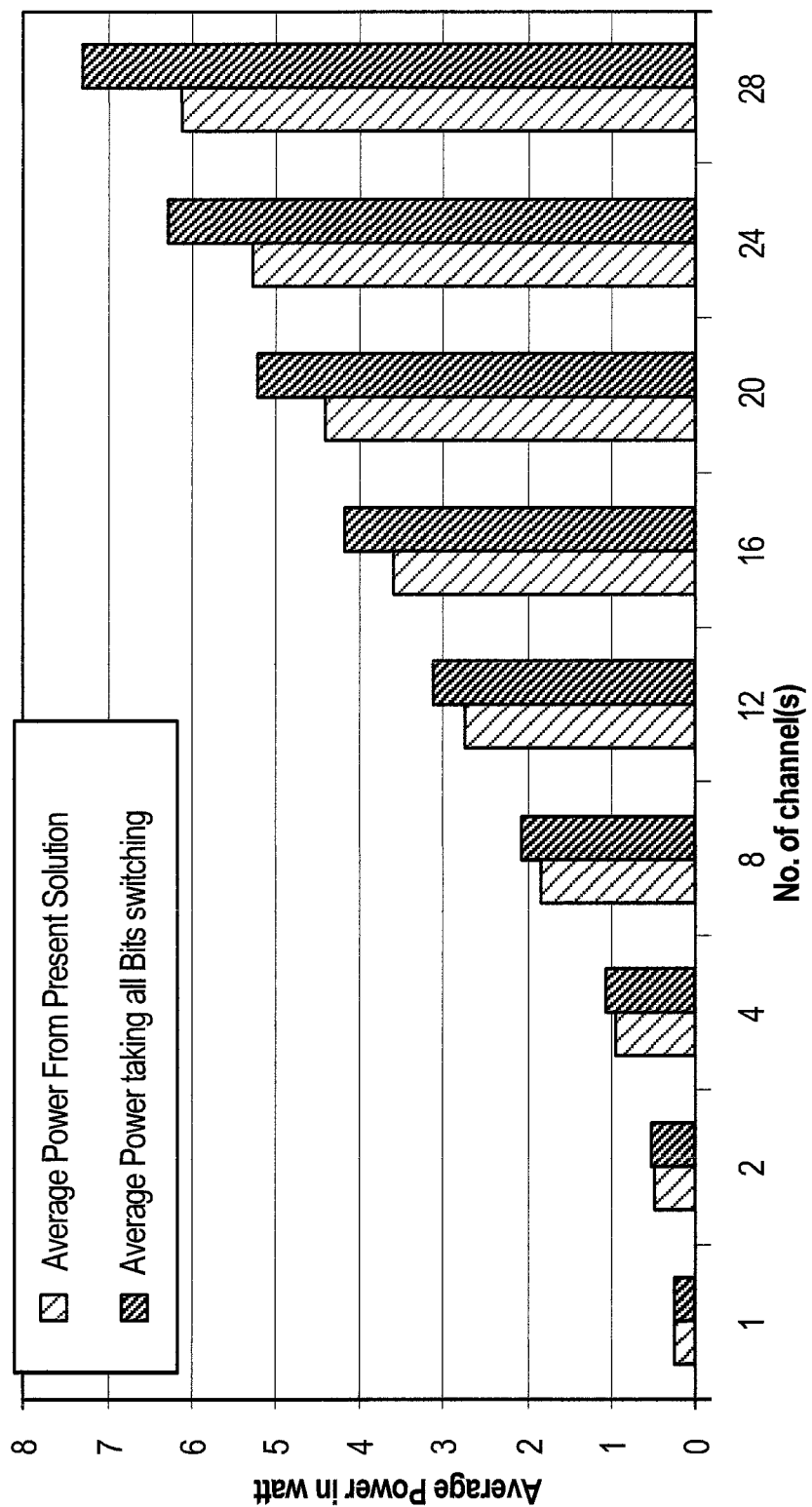
FIG. 9 is a graph illustrating a comparison between average power values calculated based on all Flash bits simultaneously switching and average power values calculated using a probability based approach for determining a number of simultaneously switching Flash bits in an SoC (system on chip)
Figure 10:
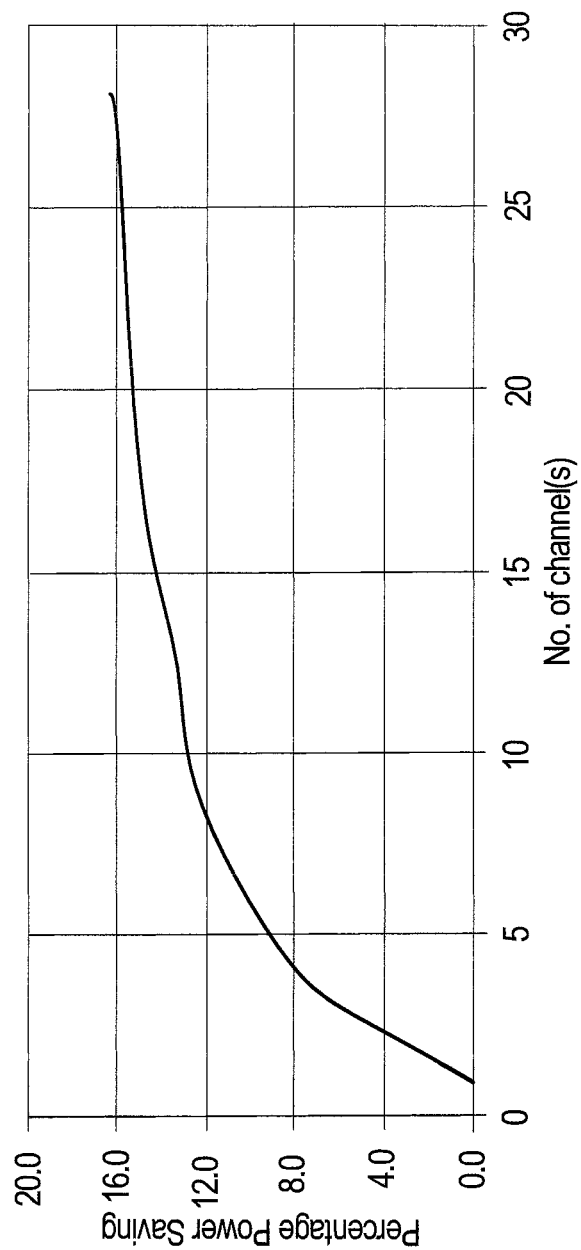
FIG. 10 is a graph showing power saving obtained using an embodiment of the disclosure.

FIG. 9 is a graph illustrating a comparison between a conventional solution (e.g., average power values calculated based on all SoC bits simultaneously switching) and a probability-based technique in accordance with an embodiment of the disclosure (e.g., average power values calculated using a probability based approach for determining a number of simultaneously switching bits in the SoC). As can be seen in FIG. 9, as the number of channels increases, the difference between the average power determined by the probability-based technique and the conventional solution increases. FIG. 10 is a graph that shows the power saved by using embodiments of the present disclosure. As can be seen in FIG. 10, for a low number of channels, power saving is negligible. However, the power saving substantially increases as the number of channels increases. The percentage increase asymptotically reaches approximately 16% for a high number of channels.

Figure 11:
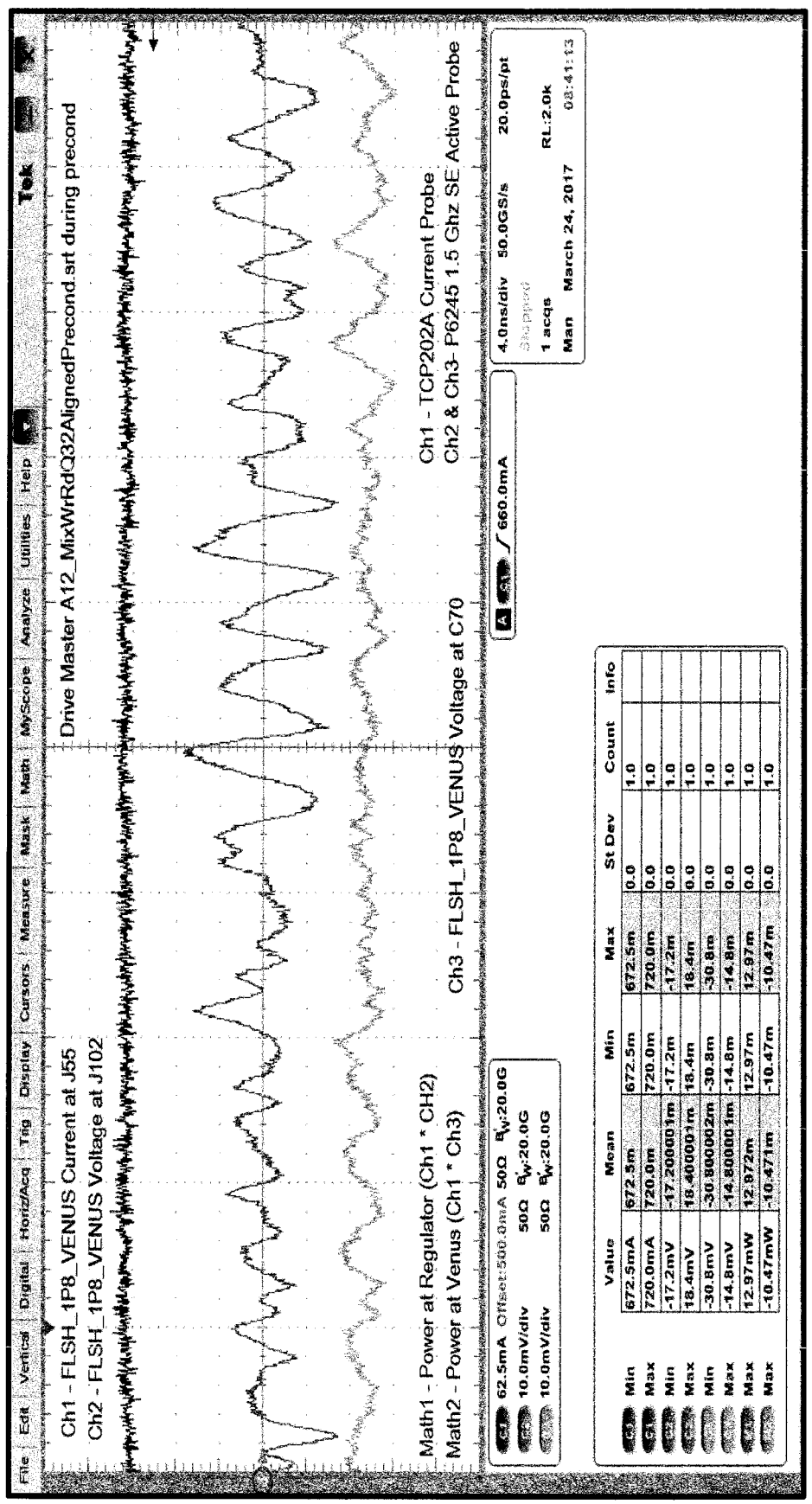
FIG. 11 is a diagrammatic illustration showing a measurement of average power of a Flash interface in a laboratory.

The method described above in connection with FIG. 6 is implemented in one embodiment to develop a SoC, which includes a controller having 8 channels. Random data is applied in all the 8 channels to compute the average current. The maximum average current measured in the laboratory for the 8-channel controller is 720 mA, as shown in the screen shot of FIG. 11.

Figure 12:
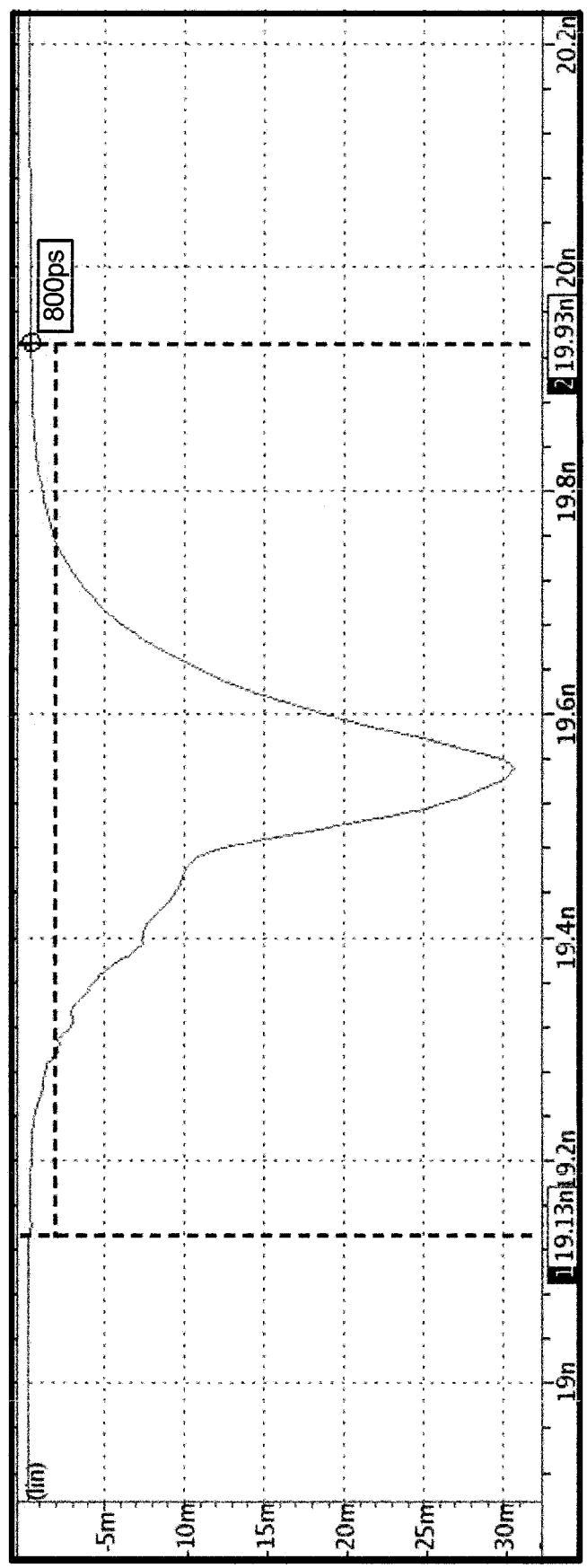
FIG. 12 is a diagrammatic illustration showing switching times of a Flash memory I/O.

The probability based present solution shows that the minimum number of data bits switching in the product life cycle of the 8-channel controller is 46 bits. As per FIG. 12, the switching time of the Flash I/O is 800 picoseconds (ps). Using this switching time in the software tool, the maximum average current computed is 1024.14 milliamperes (mA).

The difference in the average current is explained using the probability curve shown in FIG. 5B. As can be seen in FIG. 5B, the maximum number of bits that have a high number of switching probability falls in the range of 20 to 45 bits. Accordingly, the average current measurement in the laboratory or in any real life scenario would be less than the maximum average current obtained by the present solution.

Advantages of embodiments of the disclosure include the following:
A capacity of the SoC is increased without linearly increasing the power.
An optimum power is achieved for the design.
The methodology can be easily validated with measurements.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and therefore are not drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of designing a system on chip (SoC), comprising:
for a total number of bits N of the SoC, calculating a minimum number of bits $N_P$ of the total number of bits N that can simultaneously switch states without producing an error across a complete warranty time period of the SoC;
carrying out power estimation calculations for the SoC using the calculated minimum number of bits $N_P$; and
providing a power consumption value for the SoC based on an average power value for the minimum number of bits $N_P$, to allow configuration of a power supply to be used in a system employing the SoC.

2. The method of claim 1 and wherein the calculated minimum number of bits $N_P$ is less than or equal to N.

3. The method of claim 1 and wherein the carrying out the power estimation calculations for the total number of bits N for the SoC comprises carrying out steady state current and steady state power calculations for the SoC using the total number of bits N.

4. The method of claim 3 and wherein the carrying out the power estimation calculations for the SoC further comprises carrying out switching current and switching power calculations for the SoC using the calculated minimum number of bits $N_P$.

5. The method of claim 1 and wherein the calculating the minimum number of bits $N_P$ comprises calculating a probability of different ones of the total number of bits N switching simultaneously.

6. The method of claim 1 and further comprising incorporating an error correction mechanism into the SoC, wherein the error correction mechanism employs at least one error correction bit.

7. The method of claim 6 and wherein the calculating the minimum number of bits $N_P$ is carried out as a function of a probability of different ones of the total number of bits N switching simultaneously and as a function of the at least one error correction bit.

8. A method comprising:
   determining a number of channels to be employed in a system on chip (SoC), each channel of the number of channels including a number of bits per channel;
   determining a total number of bits N for the SoC based on the number of channels and based on the number of bits per channel;
   receiving warranty information for the SoC;
   calculating, based on the total number of bits N and the warranty information, a minimum number of bits $N_P$ of the total number of bits N that can simultaneously switch states without producing an error across a complete warranty time period of the SoC; and
   providing a power consumption value for the SoC based on a current consumption of the minimum number of bits $N_P$ that can simultaneously switch states without producing an error across the complete warranty time period of the SoC, to allow configuration of a power supply to be employed in a system employing the SoC.

9. The method of claim 8 and further comprising carrying out power estimation calculations for the SoC using the calculated minimum number of bits $N_P$.

10. The method of claim 8 and wherein the calculated minimum number of bits $N_P$ is less than or equal to N.

11. The method of claim 9 and wherein the carrying out the power estimation calculations for the SoC comprises carrying out steady state current and steady state power calculations for the SoC using the total number of bits N.

12. The method of claim 11 and wherein the carrying out the power estimation calculations for the SoC further comprises carrying out switching current and switching power calculations for the SoC using the calculated minimum number of bits $N_P$.

13. The method of claim 8 and wherein the calculating the minimum number of bits $N_P$ comprises calculating a probability of different ones of the total number of bits N switching states simultaneously.

14. The method of claim 8 and further comprising incorporating an error correction mechanism into the SoC, wherein the error correction mechanism employs one error correction bit thereof configured as an input to find a back to back error probability.

15. The method of claim 14 and wherein the calculating the minimum number of bits $N_P$ is carried out as a function of a probability of different ones of the total number of bits N switching states simultaneously and as a function of the one error correction bit configured as an input to find a back to back error probability.

16. A non-transitory computer-readable storage medium having encoded therein computer-executable instructions for causing a computing system programmed thereby to perform a method comprising:
   for a system on chip (SoC) having a total number of bits N, calculating a minimum number of bits $N_P$ of the total number of bits N that can simultaneously switch states without producing an error across a complete warranty time period of the SoC;
   carrying out power estimation calculations for the SoC using the calculated minimum number of bits $N_P$; and
   setting an average power value for the SoC based on an average power value for the minimum number of bits $N_P$; and
   providing a power consumption value for the SoC based on the average power value for the minimum number of bits $N_P$, to allow configuration of a power supply to be used in a system employing the SoC.

17. The computer-readable storage medium of claim 16 and wherein the calculated minimum number of bits $N_P$ is less than or equal to N.

18. The computer-readable storage medium of claim 16 and wherein the carrying out the power estimation calculations for the SoC comprises carrying out steady state current and steady state power calculations for the SoC using the total number of bits N.

19. The computer-readable storage medium of claim 18 and wherein the carrying out the power estimation calculations for the SoC further comprises carrying out switching current and switching power calculations for the SoC using the calculated minimum number of bits $N_P$.

20. The computer-readable storage medium of claim 16 and wherein the calculating the minimum number of bits $N_P$ comprises calculating a probability of different ones of the number of bits N switching states simultaneously.

* * * * *